(12) United States Patent
Kim

(10) Patent No.: US 11,329,651 B2
(45) Date of Patent: May 10, 2022

(54) INTEGRATED CIRCUIT

(71) Applicant: SK hynix Inc., Icheon-si (KR)

(72) Inventor: Woongrae Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/150,680

(22) Filed: Jan. 15, 2021

(65) Prior Publication Data

US 2022/0069825 A1    Mar. 3, 2022

(30) Foreign Application Priority Data

Aug. 25, 2020   (KR) .................. 10-2020-0107396

(51) Int. Cl.
*H03K 21/10*   (2006.01)

(52) U.S. Cl.
CPC .................. *H03K 21/10* (2013.01)

(58) Field of Classification Search
CPC ...... H03K 21/00; H03K 21/02; H03K 21/026; H03K 21/08; H03K 21/10; H03K 21/12; H03K 23/00; H03K 23/40
See application file for complete search history.

(56) References Cited

U.S. PATENT DOCUMENTS

| | | | | |
|---|---|---|---|---|
| 6,185,150 B1* | 2/2001 | Toda | ..................... | G11C 7/1078 365/194 |
| 2007/0101177 A1* | 5/2007 | Kuroki | ..................... | G06F 1/06 713/500 |
| 2012/0268170 A1* | 10/2012 | Kondo | ..................... | H03K 21/10 327/115 |
| 2015/0009774 A1* | 1/2015 | Ko | ..................... | G11C 8/06 365/230.08 |
| 2015/0187404 A1* | 7/2015 | Oh | ..................... | G11C 8/10 365/230.02 |
| 2015/0256184 A1* | 9/2015 | Park | ..................... | G11C 7/222 327/115 |
| 2016/0064057 A1* | 3/2016 | Lee | ..................... | G11C 8/06 365/233.11 |
| 2016/0226495 A1* | 8/2016 | Fujisawa | ..................... | H03K 21/026 |
| 2017/0110165 A1* | 4/2017 | Kim | ..................... | G11C 8/18 |
| 2019/0058464 A1* | 2/2019 | Choi | ..................... | H03K 5/15086 |
| 2019/0333553 A1* | 10/2019 | Choi | ..................... | G11C 7/22 |
| 2019/0384350 A1* | 12/2019 | Jang | ..................... | G06F 1/12 |
| 2020/0228123 A1* | 7/2020 | Oh | ..................... | H03L 7/0812 |
| 2021/0050855 A1* | 2/2021 | Kim | ..................... | H03K 21/026 |

FOREIGN PATENT DOCUMENTS

KR    1020150064873 A    6/2015
KR       101944964 B1    2/2019

* cited by examiner

*Primary Examiner* — Jason Crawford
(74) *Attorney, Agent, or Firm* — William Park & Associates Ltd.

(57) ABSTRACT

An integrated circuit including: a clock generation circuit configured to generate first and second divided clock signals by dividing an external clock signal; and a command generation circuit configured to synchronize and decode an external command signal based on a divided clock signal of the first and second divided clock signals, which is synchronized with a chip select signal.

14 Claims, 11 Drawing Sheets

_US 11,329,651 B2_

INTEGRATED CIRCUIT

CROSS-REFERENCES TO RELATED APPLICATION

The present application claims priority under 35 U.S.C. § 119(a) to Korean application number 10-2020-0107396, filed on Aug. 25, 2020, in the Korean Intellectual Property Office, which is incorporated herein by reference in its entirety.

BACKGROUND

1. Technical Field

Various embodiments generally relate to an integrated circuit, and more particularly, to an integrated circuit for generating an internal command signal synchronized with an internal clock signal.

2. Related Art

In general, an integrated circuit including a semiconductor apparatus and a semiconductor memory apparatus performs a preset operation based on an external command signal input from the outside. At this time, the integrated circuit needs to perform a command recognition operation for internally recognizing the external command signal. The command recognition operation indicates an operation of generating an internal command signal by synchronizing the external command signal with an internal clock signal.

Recently, the operating speeds of integrated circuits have been gradually increased according to demands of users. When the operating speed of the integrated circuit is increased, it indicates that the frequency of the external clock signal input to the integrated circuit is gradually increased. However, when the external command signal is synchronized based on the high-frequency external clock signal, it is difficult to perform an accurate synchronization operation. When it is difficult to perform the synchronization operation, it indicates that it is difficult to perform the command recognition operation. Furthermore, when the command recognition operation is performed according to the high-frequency external clock signal, a toggling operation by the high-frequency external clock signal increases unnecessary power consumption.

SUMMARY

In an embodiment, an integrated circuit may include: a clock generation circuit configured to generate first and second divided clock signals by dividing an external clock signal; and a command generation circuit configured to synchronize and decode an external command signal based on a divided clock signal of the first and second divided clock signals, which is synchronized with a chip select signal.

DETAILED DESCRIPTION

Figure 1:
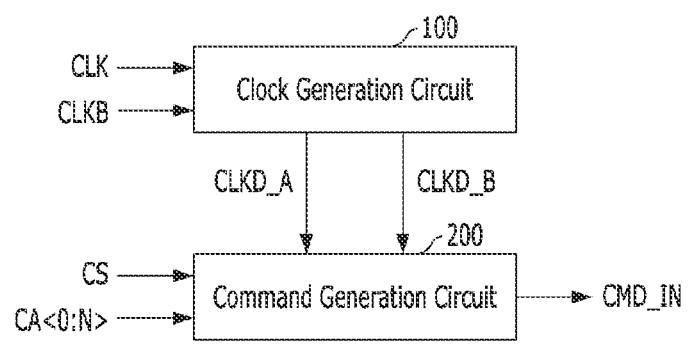
FIG. 1 is a block diagram illustrating a configuration of an integrated circuit in accordance with an embodiment.

The description of the present disclosure is merely an embodiment for a structural and/or functional description. The scope of rights of the present disclosure should not be construed as being limited to embodiments described in the specification. That is, the scope of rights of the present disclosure should be understood as including equivalents, which may realize the technical spirit, because an embodiment may be modified in various ways and may have various forms. Furthermore, objects or effects proposed in the present disclosure do not mean that a specific embodiment should include all objects or effects or include only such effects. Accordingly, the scope of rights of the present disclosure should not be understood as being limited thereby.

The meaning of the terms that are described in this application should be understood as follows.

The terms, such as the "first" and the "second," are used to distinguish one element from another element, and the scope of the present disclosure should not be limited by the terms. For example, a first element may be named a second element. Likewise, the second element may be named the first element.

An expression of the singular number should be understood as including plural expressions, unless clearly expressed otherwise in the context. The terms, such as "include" or "have," should be understood as indicating the existence of a set characteristic, number, step, operation, element, part, or a combination thereof, not excluding a possibility of the existence or addition of one or more other characteristics, numbers, steps, operations, elements, parts, or a combination thereof.

In each of steps, symbols (e.g., a, b, and c) are used for convenience of description, and the symbols do not describe order of the steps. The steps may be performed in order different from order described in the context unless specific order is clearly described in the context. That is, the steps may be performed according to described order, may be performed substantially at the same time as the described order, or may be performed in reverse order of the described order.

All the terms used herein, including technological or scientific terms, have the same meanings as those that are typically understood by those skilled in the art, unless otherwise defined. Terms defined in commonly used dictionaries should be construed as having the same meanings as those in the context in related technology and should not be construed as having ideal or excessively formal meanings, unless clearly defined in the application.

Various embodiments are directed to an integrated circuit capable of generating an internal command signal synchronized with an internal clock signal.

Objects of the present disclosure are not limited to the aforementioned objects, and other objects not described above may be evidently understood by those skilled in the art, to which the present disclosure pertains, from the following description.

In accordance with the present embodiment, the integrated circuit can synchronize an external command signal based on a low-frequency internal clock signal, thereby raising the accuracy of a command recognition operation.

Furthermore, the integrated circuit may use a low-frequency internal clock signal to synchronize an external command signal, thereby minimizing power consumption during a synchronization and decoding operation for a command signal.

FIG. 1 is a block diagram illustrating a configuration of an integrated circuit in accordance with an embodiment.

Referring to FIG. 1, the integrated circuit may include a clock generation circuit 100 and a command generation circuit 200.

The clock generation circuit 100 may be configured to generate a first divided clock signal CLKD_A and a second divided clock signal CLKD_B by dividing an external clock signals CLK and CLKB. The external clock signals CLK and CLKB may include a primary external clock signal CLK and a secondary external clock signal CLKB. Although described below again, the first divided clock signal CLKD_A may correspond to the primary external clock signal CLK, and the second divided clock signal CLKD_B may correspond to the secondary external clock signal CLKB.

Figure 2:
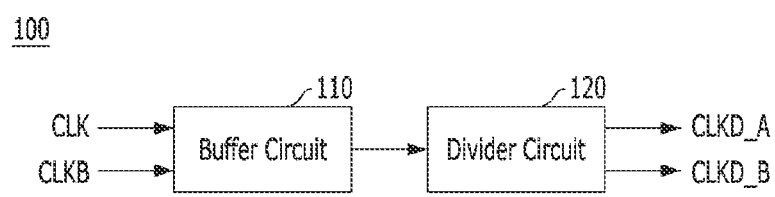
FIG. 2 is a block diagram illustrating a configuration of a clock generation circuit of FIG. 1.

FIG. 2 is a block diagram illustrating a configuration of the clock generation circuit 100 of FIG. 1.

Referring to FIG. 2, the clock generation circuit 100 may include a buffer circuit 110 and a divider circuit 120.

The buffer circuit 110 may be configured to buffer the external clock signals CLK and CLKB. The buffer circuit 110 may buffer the primary external clock signal CLK and the secondary external clock signal CLKB, which are the external clock signals CLK and CLKB, and output the buffered signals.

The divider circuit 120 may be configured to generate the first and second divided clock signals CLKD_A and CLKD_B by dividing the clock signals output from the buffer circuit 110. The divider circuit 120 may generate the first divided clock signal CLKD_A corresponding to the primary external clock signal CLK and the second divided clock signal CLKD_B corresponding to the secondary external clock signal CLKB by dividing the buffered clock signals output from the buffer circuit 110. For example, the first and second divided clock signals CLKD_A and CLKD_B may be low-frequency clock signals obtained by dividing the external clock signals CLK and CLKB by two.

Referring back to FIG. 1, the command generation circuit 200 may be configured to synchronize and decode an external command signal CA<0:N> based on a divided clock signal synchronized with a chip select signal CS, between the first and second divided clock signals CLKD_A and CLKD_B, wherein N is a natural number. The command generation circuit 200 may generate an internal command signal CMD_IN by synchronizing and decoding the external command signal CA<0:N>. The external command signal CA<0:N> may be configured as a plurality of bits including a command including a write command, a read command and the like and an address related to the command.

Figure 3:
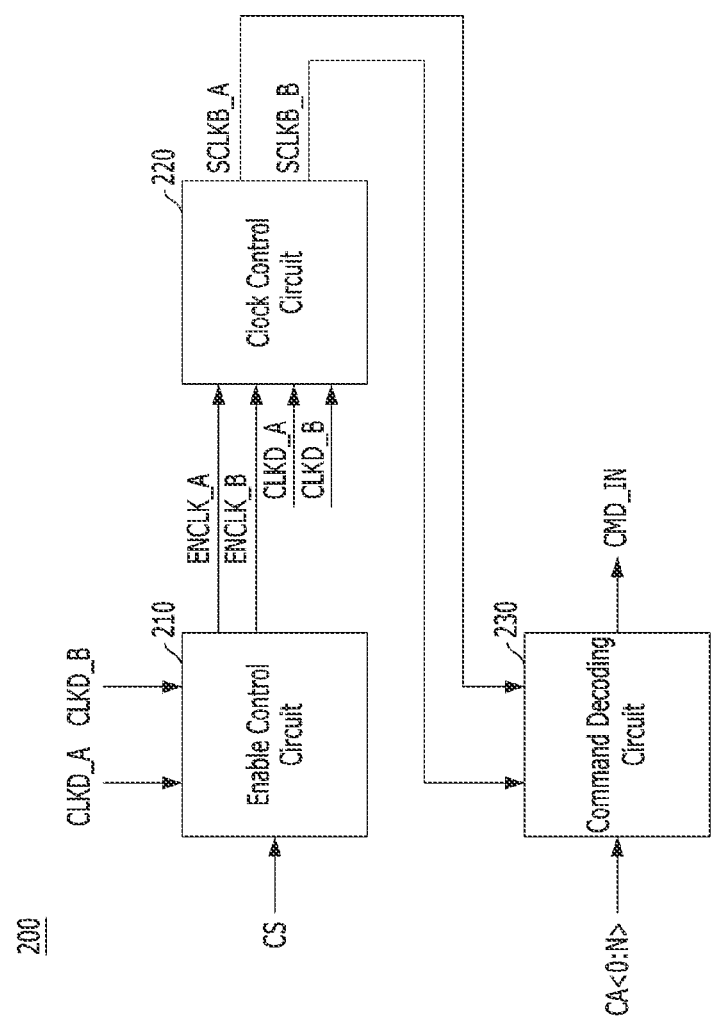
FIG. 3 is a block diagram illustrating a configuration of an embodiment of a command generation circuit of FIG. 1.

FIG. 3 is a block diagram illustrating a configuration of an embodiment of the command generation circuit 200 of FIG. 1.

Referring to FIG. 3, the command generation circuit 200 may include an enable control circuit 210, a clock control circuit 220 and a command decoding circuit 230.

The enable control circuit 210 may be configured to generate a clock enable signal corresponding to the first or second divided clock signal CLKD_A or CLKD_B based on a divided clock signal of the first and second divided clock signals CLKD_A and CLKD_B, which toggles at a point of time that the chip select signal CS is input. The clock enable signal may include a first clock enable signal ENCLK_A corresponding to the first divided clock signal CLKD_A and a second clock enable signal ENCLK_B corresponding to the second divided clock signal CLKD_B.

Thus, when the first divided clock signal CLKD_A toggles at the point of time that the chip select signal CS is input, the enable control circuit 210 may change the first clock enable signal ENCLK_A to a preset logic level, and output the first clock enable signal ENCLK_A. Thus, when the second divided clock signal CLKD_B toggles at the point of time that the chip select signal CS is input, the enable control circuit 210 may change the second clock enable signal ENCLK_B to a preset logic level, and output the second clock enable signal ENCLK_B. That is, the enable control circuit 210 may change the first or second clock enable signal to the preset logic level based on a divided clock signal of the first and second divided clock signals CLKD_A and CLKD_B, which toggles at a point of time that the chip select signal CS is input.

The clock control circuit 220 may be configured to control an operation of enabling synchronization clock signals corresponding to the first and second divided clock signals CLKD_A and CLKD_B based on the first and second clock enable signals ENCLK_A and ENCLK_B which are clock enable signals. The synchronization clock signal may include a first synchronization clock signal SCLKB_A corresponding to the first divided clock signal CLKD_A and a second synchronization clock signal SCLKB_B corresponding to the second divided clock signal CLKD_B.

Thus, the clock control circuit 220 may output the first divided clock signal CLKD_A as the first synchronization clock signal SCLKB_A based on the first clock enable signal ENCLK_A. Thus, the clock control circuit 220 may output the second divided clock signal CLKD_B as the second synchronization clock signal SCLKB_B based on the second clock enable signal ENCLK_B. That is, the clock control circuit 220 may control the operation of enabling the first or second synchronization clock signal SCLKB_A or SCLKB_B based on the first or second clock enable signal ENCLK_A or ENCLK_B.

The command decoding circuit 230 may be configured to synchronize and decode the external command signal CA<0:N> based on the first or second synchronization clock signal SCLKB_A or SCLKB_B which is a synchronization clock signal. As described above, the clock control circuit 220 may control the operation of enabling the first or second synchronization clock signal SCLKB_A or SCLKB_B based on the first or second clock enable signal ENCLK_A or ENCLK_B. Thus, the command decoding circuit 230 may synchronize and decode the external command signal CA<0:N> based on any one synchronization clock signal of the first and second synchronization clock signals SCLKB_A and SCLKB_B. Here, the first and second synchronization clock signals SCLKB_A and SCLKB_B are internal clock signals with a relatively low frequency. Therefore, the command decoding circuit 230 may generate the internal command signal CMD_IN synchronized with the low-frequency internal clock signal. In an embodiment, a signal with a low frequency or relatively low frequency may have a frequency which is lower than a signal having a high frequency, and a signal with a high frequency or relatively high frequency may have a frequency which is higher than a signal having a low frequency.

The integrated circuit in accordance with the present embodiment may generate the first and second divided clock signals CLKD_A and CLKD_B by dividing the primary external clock signal CLK and the secondary external clock signal CLKB which are external clock signals. The integrated circuit may synchronize and decode the external command signal CA<0:N> based on a divided clock signal of the first and second divided clock signals CLKD_A and CLKD_B, which is synchronized with the chip select signal CS. Therefore, the integrated circuit may synchronize and decode the external command signal CA<0:N> using the relatively low-frequency divided clock signal, thereby performing a command recognition operation more accurately. Furthermore, the integrated circuit may synchronize and decode the external command signal CA<0:N> using the relatively low-frequency divided clock signal, thereby reducing power consumed during the synchronization and decoding operation.

Figure 4:
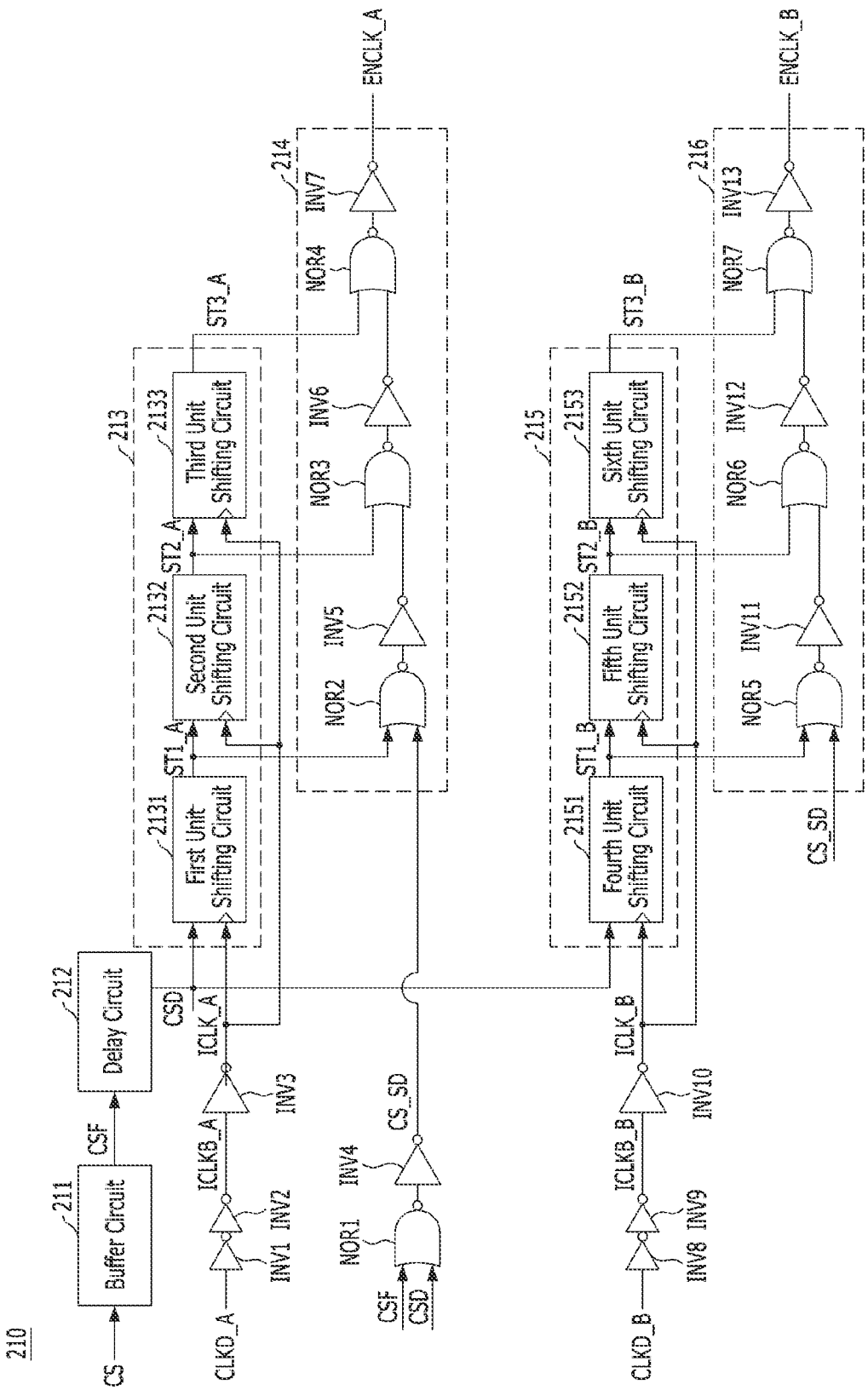
FIG. 4 is a diagram illustrating a configuration of an enable control circuit of FIG. 3.

FIG. 4 is a diagram illustrating a configuration of the enable control circuit 210 of FIG. 3.

Referring to FIG. 4, the enable control circuit 210 may be configured to change the first or second clock enable signal ENCLK_A or ENCLK_B to the preset logic level based on a divided clock signal of the first and second divided clock signals CLKD_A and CLKD_B, which toggles at a point of time that the chip select signal CS is input, as described above. The enable control circuit 210 may include a buffer circuit 211, a delay circuit 212, a first shifting circuit 213, a first logic control circuit 214, a second shifting circuit 215, a second logic control circuit 216 and a plurality of logic circuits.

The buffer circuit 211 may be configured to generate a buffered chip select signal CSF by buffering the chip select signal CS. The delay circuit 212 may be configured to generate the delayed chip select signal CSD by delaying the buffered chip select signal CSF by a preset delay amount. The buffered chip select signal CSF and the delayed chip select signal CSD will be described with reference to the timing diagram of FIG. 14 which will be described below. The word "preset" as used herein with respect to a parameter, such as a preset delay amount, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

First and second inverters INV1 and INV2 may be coupled in series, and receive the first divided clock signal CLKD_A and output the first divided clock signal CLKD_A. A third inverter INV3 may invert an output signal ICLKB_A of the second inverter INV2, and output the inverted signal as a first internal clock signal ICLK_A. The first shifting circuit 213 may be configured to shift the delayed chip select signal CSD based on the first internal clock signal ICLK_A. The first shifting circuit 213 may shift the delayed chip select signal CSD by a decoding operation time for the external command signal CA<0:N>. The delayed chip select signal CSD input to the first shifting circuit 213 may correspond to the chip select signal CS, and the first internal clock signal ICLK_A may correspond to the first divided clock signal CLKD_A. That is, the first shifting circuit 213 may shift the chip select signal CS based on the first divided clock signal CLKD_A. The first shifting circuit 213 may include first to third unit shifting circuits 2131, 2132 and 2133.

The first unit shifting circuit 2131 may synchronize the delayed chip select signal CSD of the delay circuit 212 with the first internal clock signal ICLK_A, and output the synchronized signal as a first shifting signal ST1_A. The second unit shifting circuit 2132 may synchronize the first shifting signal ST1_A, which is the output signal of the first unit shifting circuit 2131, with the first internal clock signal ICLK_A, and output the synchronized signal as a second shifting signal ST2_A. The third unit shifting circuit 2133 may synchronize the second shifting signal ST2_A, which is the output signal of the second unit shifting circuit 2132, with the first internal clock signal ICLK_A, and output the synchronized signal as a third shifting signal ST3_A. Each of the first to third unit shifting circuits 2131 to 2133 may be configured as a flip-flop which shifts an input signal based on the first internal clock signal ICLK_A.

The above-described first shifting circuit 213 may include the first to third unit shifting circuits 2131, 2132 and 2133, for example. The first shifting circuit 213 in accordance with the present embodiment may be designed by changing the number of unit shifting circuits to shift the chip select signal CS by the synchronization and decoding operation time for the external command signal CA<0:N>.

A first NOR gate NOR1 may receive the buffered chip select signal CSF and the delayed chip select signal CSD. A fourth inverter INV4 may receive the output signal of the first NOR gate NOR1, and generate a chip select pulse signal CS_SD. The chip select pulse signal CS_SD may be described with reference to the timing diagram of FIG. 14.

Then, the first logic control circuit 214 may be configured to generate the first clock enable signal ENCLK_A having an active interval that is set based on the delayed chip select signal CSD and the output signal of the first shifting circuit 213. The first logic control circuit 214 may include a plurality of logic circuits which will be described below.

A second NOR gate NOR2 may receive the chip select pulse signal CS_SD and the first shifting signal ST1_A of the first unit shifting circuit 2131. A fifth inverter INV5 may receive the output signal of the second NOR gate NOR2, and invert and output the received signal. A third NOR gate NOR3 may receive the second shifting signal ST2_A of the second unit shifting circuit 2132 and the output signal of the fifth inverter INV5. A sixth inverter INV6 may receive an output signal of the third NOR gate NOR3, and invert and output the received signal. A fourth NOR gate NOR4 may receive the third shifting signal ST3_A of the third unit shifting circuit 2133 and the output signal of the sixth inverter INV6. A seventh inverter INV7 may receive an output signal of the fourth NOR gate NOR4, and generate the first clock enable signal ENCLK_A.

According to the above-described configuration, when the first divided clock signal CLKD_A toggles at the point of time that the chip select signal CS is input, the enable control circuit 210 may enable the first clock enable signal ENCLK_A. The enable control circuit 210 may disable the first clock enable signal ENCLK_A by shifting the chip select signal CS by the synchronization and decoding operation time for the external command signal CA<0:N>.

For reference, such a configuration may be related to the first divided clock signal CLKD_A. The configuration may be described in detail with reference to the following timing diagram. Hereafter, a configuration related to the second divided clock signal CLKD_B will be described.

Eighth and ninth inverters INV8 and INV9 may be coupled in series, and receive the second divided clock signal CLKD_B and output the received signal. A tenth inverter INV10 may invert an output signal ICLKB_B of the ninth inverter INV9, and output the inverted signal as a second internal clock signal ICLK_B. The second shifting circuit 215 may be configured to shift the delayed chip select signal CSD based on the second internal clock signal ICLK_B. The second shifting circuit 215 may shift the delayed chip select signal CSD by the decoding operation time for the external command signal CA<0:N>. The second internal clock signal ICLK_B may correspond to the second divided clock signal CLKD_B. That is, the second shifting circuit 215 may shift the chip select signal CS based on the second divided clock signal CLKD_B. The second shifting circuit 215 may include fourth to sixth unit shifting circuits 2151 to 2153.

The fourth unit shifting circuit 2151 may synchronize the delayed chip select signal CSD of the delay circuit 212 with the second internal clock signal ICLK_B, and output the synchronized signal as a first shifting signal ST1_B. The fifth unit shifting circuit 2152 may synchronize the first shifting signal ST1_B, which is the output signal of the fourth unit shifting circuit 2151, with the second internal clock signal ICLK_B, and output the synchronized signal as a second shifting signal ST2_B. The sixth unit shifting circuit 2153 may synchronize the second shifting signal ST2_B, which is the output signal of the fifth unit shifting circuit 2152, with the second internal clock signal ICLK_B, and output the synchronized signal as a third shifting signal ST3_B. Each of the fourth to sixth unit shifting circuits 2151 to 2153 may be configured as a flip-flop which shifts an input signal based on the second divided clock signal CLKD_B.

The above-described second shifting circuit 215 may be designed by changing the number of unit shifting circuits to shift the chip select signal CS by the synchronization and decoding operation time for the external command signal CA<0:N>, like the first shifting circuit 213.

Then, the second logic control circuit 216 may be configured to generate the second clock enable signal ENCLK_B having an active interval that is set, based on the delayed chip select signal CSD and the output signal of the second shifting circuit 215. The second logic control circuit 216 may include a plurality of logic circuits which will be described below.

A fifth NOR gate NOR5 may receive the chip select pulse signal CS_SD and the first shifting signal ST1_B of the fourth unit shifting circuit 2151. An 11th inverter INV11 may receive an output signal of the fifth NOR gate NOR5, and invert and output the received signal. A sixth NOR gate NOR6 may receive the second shifting signal ST2_B of the fifth unit shifting circuit 2152 and an output signal of the 11th inverter INV11. A 12th inverter INV12 may receive an output signal of the sixth NOR gate NOR6, and invert and output the received signal. A seventh NOR gate NOR7 may receive the third shifting signal ST3_B of the sixth unit shifting circuit 2153 and the output signal of the 12th inverter INV12. A 13th inverter INV13 may receive an output signal of the seventh NOR gate NOR7, and generate the second clock enable signal ENCLK_B.

According to the above-described configuration, when the second divided clock signal CLKD_B toggles at the point of time that the chip select signal CS is input, the enable control circuit 210 may enable the second clock enable signal ENCLK_B. The enable control circuit 210 may disable the second clock enable signal ENCLK_B by shifting the chip select signal CS by the synchronization and decoding operation time for the external command signal CA<0:N>.

Figure 5:
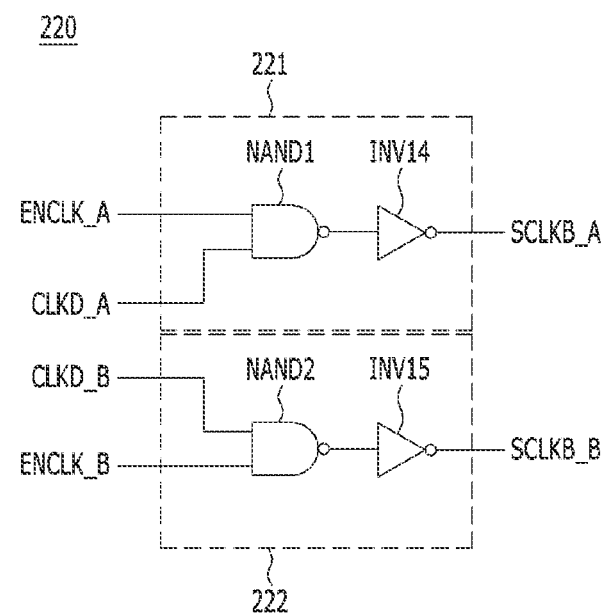
FIG. 5 is a circuit diagram illustrating a configuration of a clock control circuit of FIG. 3.

FIG. 5 is a circuit diagram illustrating a configuration of the clock control circuit 220 of FIG. 3.

Referring to FIG. 5, as described above, the clock control circuit 220 may be configured to control the operation of enabling synchronization clock signals corresponding to the first and second divided clock signals CLKD_A and CLKD_B, respectively, based on the first and second clock enable signals ENCLK_A and ENCLK_B. The clock control circuit 220 may include a first synchronization clock generation circuit 221 and a second synchronization clock generation circuit 222.

The first synchronization clock generation circuit 221 may be configured to output the first divided clock signal CLKD_A as the first synchronization clock signal SCLKB_A based on the first clock enable signal ENCLK_A corresponding to the first divided clock signal CLKD_A. The first synchronization clock generation circuit 221 may include a first NAND gate NAND1 configured to receive the first divided clock signal CLKD_A and the first clock enable signal ENCLK_A and a 14th inverter INV14 configured to receive an output signal of the first NAND gate NAND1 and invert and output the received signal. The 14th inverter INV14 may output the first synchronization clock signal SCLKB_A. Thus, the first synchronization clock generation circuit 221 may output the first divided clock signal CLKD_A as the first synchronization clock signal SCLKB_A based on the first clock enable signal ENCLK_A.

The second synchronization clock generation circuit 222 may be configured to output the second divided clock signal CLKD_B as the second synchronization clock signal SCLKB_B based on the second clock enable signal ENCLK_B corresponding to the second divided clock signal CLKD_B. The second synchronization clock generation circuit 222 may include a second NAND gate NAND2 configured to receive the second divided clock signal CLKD_B and the second clock enable signal ENCLK_B and a 15th inverter INV15 configured to receive an output signal of the second NAND gate NAND2 and invert and output the received signal. The 15th inverter INV15 may output the second synchronization clock signal SCLKB_B. Thus, the second synchronization clock generation circuit 222 may output the second divided clock signal CLKD_B as the second synchronization clock signal SCLKB_B based on the second clock enable signal ENCLK_B.

Through such a configuration, the clock control circuit 220 may output the first divided clock signal CLKD_A as the first synchronization clock signal SCLKB_A or output the second divided clock signal CLKD_B as the second synchronization clock signal SCLKB_B based on the first and second clock enable signals ENCLK_A and ENCLK_B. The first and second synchronization clock signals SCLKB_A and SCLKB_B output from the clock control circuit 220 may be provided to the command decoding circuit 230 of FIG. 3. The command decoding circuit 230 may synchronize and decode the external command signal CA<0:N> based on the enabled first or second synchronization clock signal SCLKB_A or SCLKB_B.

The integrated circuit in accordance with the present embodiment may generate the first and second divided clock signals CLKD_A and CLKD_B by dividing the primary external clock signal CLK and the secondary external clock signal CLKB which are external clock signals. The integrated circuit may synchronize and decode the external command signal CA<0:N> based on a divided clock signal of the first and second divided clock signals CLKD_A and CLKD_B, which is synchronized with the chip select signal CS.

Figure 6:
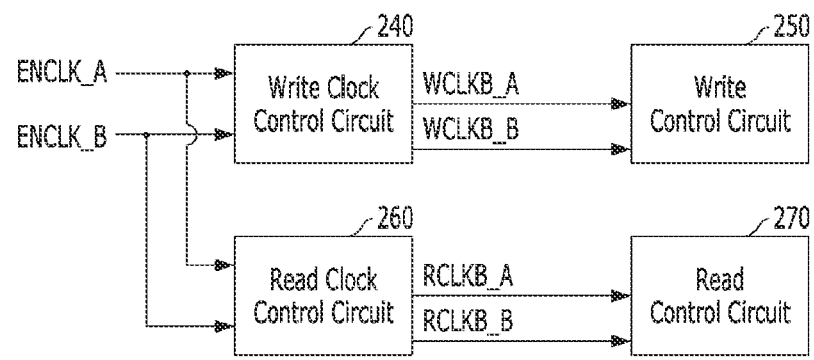
FIG. 6 is a block diagram illustrating a configuration of the integrated circuit in accordance with the present embodiment.

FIG. 6 is a block diagram illustrating a configuration of the integrated circuit in accordance with the present embodiment.

Referring to FIG. 6, the integrated circuit may further include a write clock control circuit 240 and a read clock control circuit 260.

The write clock control circuit 240 may be configured to control an enable operation of a write clock signal based on the first or second clock enable signal ENCLK_A or ENCLK_B which is a clock enable signal. The write clock signal may include a first write clock signal WCLKB_A corresponding to the first divided clock signal CLKD_A and a second write clock signal WCLKB_B corresponding to the second divided clock signal CLKD_B.

Figure 7:
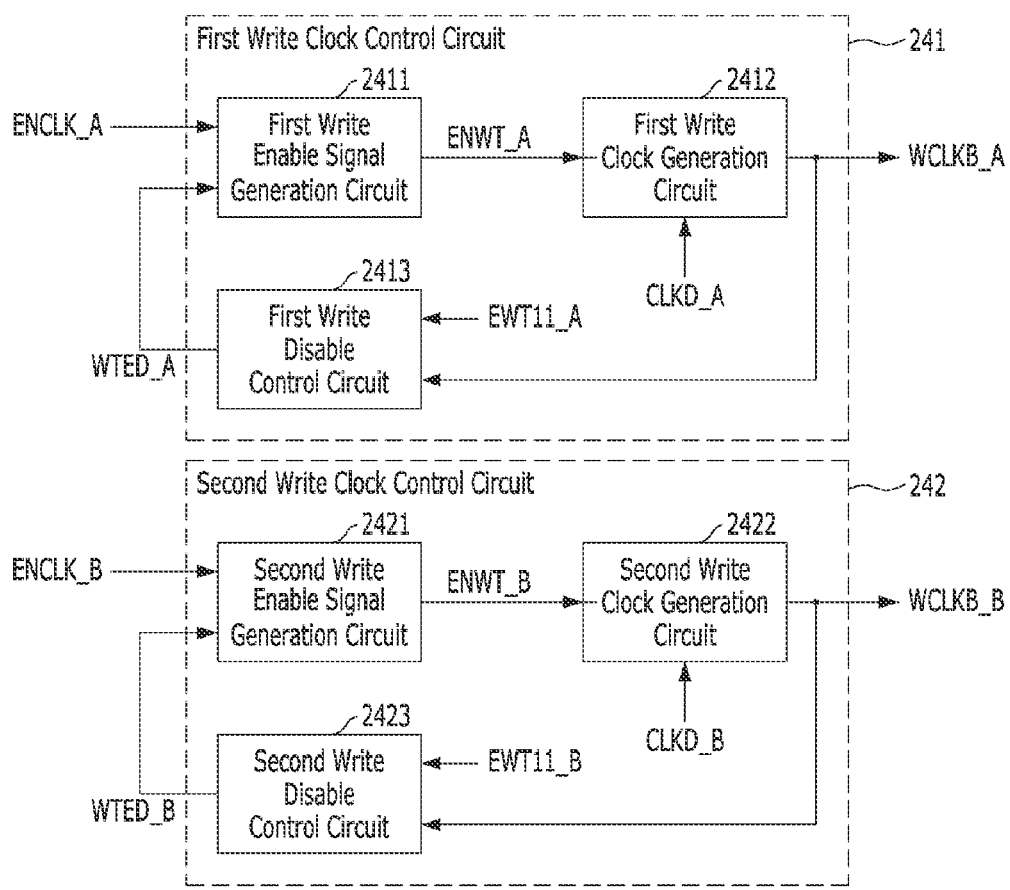
FIG. 7 is a block diagram illustrating a configuration of a write clock control circuit of FIG. 6.

FIG. 7 is a block diagram illustrating a configuration of the write clock control circuit 240 of FIG. 6.

Referring to FIG. 7, the write clock control circuit 240 may include a first write clock control circuit 241 and a second write clock control circuit 242.

The first write clock control circuit 241 may be configured to generate the first write clock signal WCLKB_A based on the first clock enable signal ENCLK_A. The first write clock control circuit 241 may include a first write enable signal generation circuit 2411, a first write clock generation circuit 2412 and a first write disable control circuit 2413.

The first write enable signal generation circuit 2411 may be configured to generate a first write enable signal ENWT_A having an active interval that is set, based on the first clock enable signal ENCLK_A and a first write disable signal WTED_A. The first write clock generation circuit 2412 may be configured to output the first divided clock signal CLKD_A as the first write clock signal WCLKB_A based on the first write enable signal ENWT_A. The first write disable control circuit 2413 may be configured to shift a first write decoding signal EWT11_A based on the first write clock signal WCLKB_A, and generate the first write disable signal WTED_A. The first write decoding signal EWT11_A may be generated by the command decoding circuit 230 of FIG. 3, and the first write decoding signal EWT11_A may be described below with reference to FIG. 13 which will be described below.

The second write clock control circuit 242 may be configured to generate the second write clock signal WCLKB_B based on the second clock enable signal ENCLK_B. The second write clock control circuit 242 may include a second write enable signal generation circuit 2421, a second write clock generation circuit 2422 and a second write disable control circuit 2423.

The second write enable signal generation circuit 2421 may be configured to generate a second write enable signal ENWT_B whose active interval is set based on the second clock enable signal ENCLK_B and a second write disable signal WTED_B. The second write clock generation circuit 2422 may be configured to output the second divided clock signal CLKD_B as the second write clock signal WCLKB_B based on the second write enable signal ENWT_B. The second write disable control circuit 2423 may be configured to shift a second write decoding signal EWT11_B based on the second write clock signal WCLKB_B, and generate the second write disable signal WTED_B. The second write decoding signal EWT11_B may be generated by the command decoding circuit 230 of FIG. 3, and the second write decoding signal EWT11_B may be described below with reference to FIG. 12 which will be described below.

Figure 8:
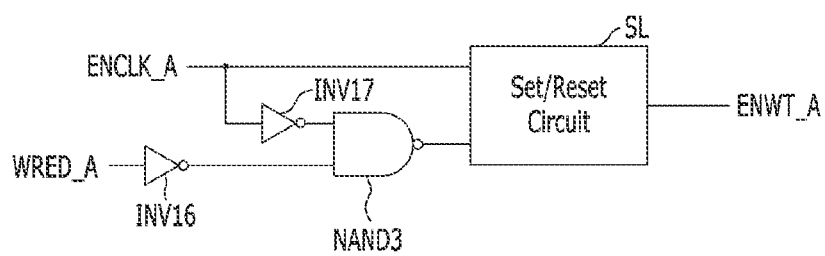
FIG. 8 is a diagram illustrating a configuration of a first write enable signal generation circuit of FIG. 7.

FIG. 8 is a diagram illustrating a configuration of the first write enable signal generation circuit 2411 of FIG. 7.

Referring to FIG. 8, the first write enable signal generation circuit 2411 may include a plurality of logic circuits and a set/reset circuit SL.

A 16th inverter INV16 may receive the first write disable signal WTED_A. A 17th inverter INV17 may receive the first clock enable signal ENCLK_A. A third NAND gate NAND3 may receive an output signal of the 16 inverter INV16 and an output signal of the 17th inverter INV17. The set/reset circuit SL may generate the first write enable signal ENWT_A which is set based on the first clock enable signal ENCLK_A, and reset based on the output signal of the third NAND gate NAND3. The set/reset circuit SL may be configured as an SR latch. Therefore, the first write enable signal generation circuit 2411 may generate the first write enable signal ENWT_A whose active interval is set based on the first clock enable signal ENCLK_A and the first write disable signal WTED_A.

Figure 9:
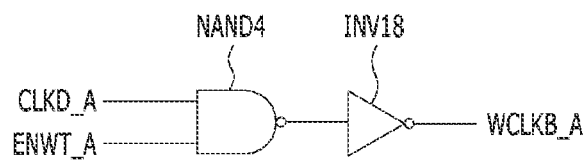
FIG. 9 is a diagram illustrating a configuration of a first write clock generation circuit of FIG. 7.

FIG. 9 is a diagram illustrating a configuration of the first write clock generation circuit 2412 of FIG. 7.

Referring to FIG. 9, the first write clock generation circuit 2412 may include a fourth NAND gate NAND4 configured to receive the first divided clock signal CLKD_A and the first write enable signal ENWT_A and an 18th inverter INV18 configured to receive an output signal of the fourth NAND gate NAND4, invert the received signal, and output the inverted signal as the first write clock signal WCLKB_A. Thus, the first write clock generation circuit 2412 may output the first divided clock signal CLKD_A as the first write clock signal WCLKB_A based on the first write enable signal ENWT_A.

Figure 10:
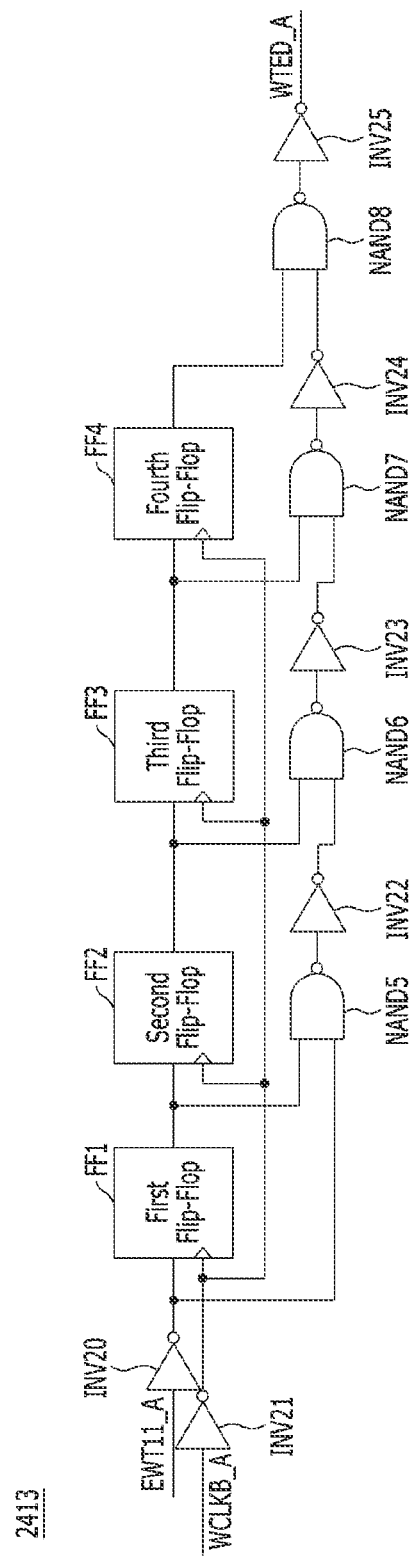
FIG. 10 is a diagram illustrating a configuration of a first write disable control circuit of FIG. 7.

FIG. 10 is a diagram illustrating a configuration of the first write disable control circuit 2413 of FIG. 7.

Referring to FIG. 10, the first write disable control circuit 2413 may include a plurality of flip-flops FF1 to FF4 and a plurality of logic circuits.

A 20th inverter INV20 may receive the first write decoding signal EWT11_A and invert and output the received signal. A 21st inverter INV21 may receive a first write clock signal WCLKB_A and invert and output the received signal. The first to fourth flip-flops FF1 to FF4 may be coupled in series, and output an input signal based on the output signal of the 21st inverter INV21. A fifth NAND gate NAND5 may receive the output signal of the first flip-flop FF1 and the output signal of the 20th inverter INV20, and a 22nd inverter INV22 may invert and output an output signal of the fifth NAND gate NAND5. A sixth NAND gate NAND6 may receive the output signal of the second flip-flop FF2 and the output signal of the 22nd inverter INV22, and a 23rd inverter INV23 may invert and output an output signal of the sixth NAND gate NAND6. A seventh NAND gate NAND7 may receive the output signal of the third flip-flop FF3 and the output signal of the 23rd inverter INV23, and a 24th inverter INV24 may invert and output an output signal of the seventh NAND gate NAND7. An eighth NAND gate NAND8 may receive the output signal of the fourth flip-flop FF4 and the output signal of the 24th inverter INV24, and a 25th inverter INV25 may receive an output signal of the eighth NAND gate NAND8, invert the received signal, and output the inverted signal as the first write disable signal WTED_A.

Therefore, the first write disable control circuit 2413 may shift the first write decoding signal EWT11_A based on the first write clock signal WCLKB_A. The first write disable control circuit 2413 may generate the first write disable signal WTED_A through a shifting operation. The number of flip-flops included in the first write disable control circuit 2413 may be differently designed according to the write operation time.

Referring back to FIG. 7, the second write clock control circuit 242 may have a similar configuration to the first write clock control circuit 241 described with reference to FIGS. 8 to 10. In other words, the second write enable signal generation circuit 2421 may receive the second clock enable signal ENCLK_B and generate the second write enable signal ENWT_B, compared to the first write enable signal generation circuit 2411. The second write clock generation circuit 2422 may receive the second write enable signal ENWT_B and generate the second write clock signal WCLKB_B, compared to the first write clock generation circuit 2412. The second write disable control circuit 2423 may receive the second write clock signal WCLKB_B and the second write decoding signal EWT11_B, and generate the second write disable signal WTED_B, compared to the first write disable control circuit 2413. Therefore, the detailed descriptions of the second write clock control circuit 242 may be omitted herein.

Referring back to FIG. 6, a write control circuit 250 may perform a control operation related to a write operation based on the first or second write clock signal WCLKB_A or WCLKB_B generated by the write clock control circuit 240. The integrated circuit in accordance with the embodiment of the present disclosure may enable the first or second write clock signal WCLKB_A or WCLKB_B based on the first or second clock enable signal ENCLK_A or ENCLK_B. Therefore, the integrated circuit may use the first or second write clock signal WCLKB_A or WCLKB_B when performing the control operation related to the write operation, thereby reducing power consumption during the control operation related to the write operation.

Figure 11:
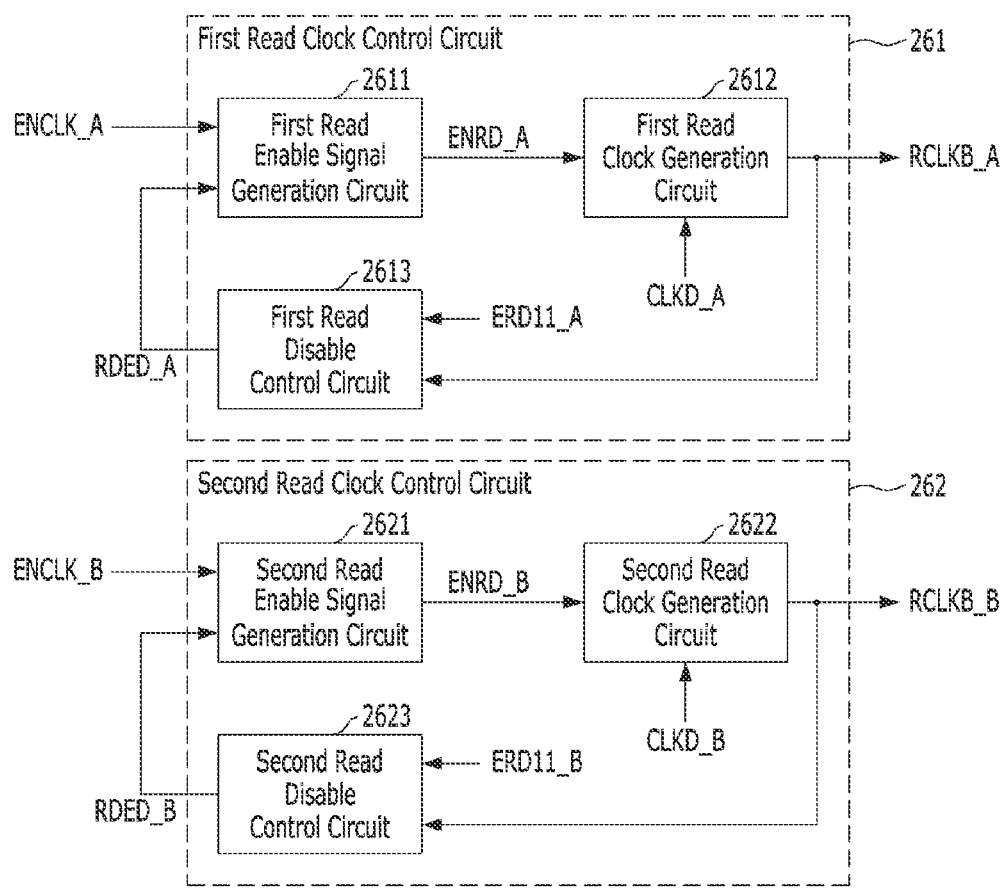
FIG. 11 is a block diagram illustrating a configuration of a read clock control circuit of FIG. 6.

FIG. 11 is a block diagram illustrating a configuration of the read clock control circuit 260 of FIG. 6.

Referring to FIG. 11, the read clock control circuit 260 may include a first read clock control circuit 261 and a second read clock control circuit 262.

The first read clock control circuit 261 may be configured to generate a first read clock signal RCLKB_A based on the first clock enable signal ENCLK_A. The first read clock control circuit 261 may include a first read enable signal generation circuit 2611, a first read clock generation circuit 2612 and a first read disable control circuit 2613.

The first read enable signal generation circuit 2611 may be configured to generate a first read enable signal ENRD_A having an active interval that is set based on the first clock enable signal ENCLK_A and a first read disable signal RDED_A. The first read clock generation circuit 2612 may output the first divided clock signal CLKD_A as the first read clock signal RCLKB_A based on the first read enable signal ENRD_A. The first read disable control circuit 2613 may be configured to shift a first read decoding signal ERD11_A based on the first read clock signal RCLKB_A, and generate the first read disable signal RDED_A. The first read decoding signal ERD11_A may be generated by the command decoding circuit 230 of FIG. 3, and the first read decoding signal ERD11_A may be described below with reference to FIG. 12.

The second read clock control circuit 262 may be configured to generate a second read clock signal RCLKB_B based on the second clock enable signal ENCLK_B. The second read clock control circuit 262 may include a second read enable signal generation circuit 2621, a second read clock generation circuit 2622 and a second read disable control circuit 2623.

The second read enable signal generation circuit 2621 may be configured to generate a second read enable signal ENRD_B whose active interval is set based on the second clock enable signal ENCLK_B and a second read disable signal RDED_B. The second read clock generation circuit 2622 may output the second divided clock signal CLKD_B as the second read clock signal RCLKB_B based on the second read enable signal ENRD_B. The second read disable control circuit 2623 may be configured to shift a second read decoding signal ERD11_B based on the second read clock signal RCLKB_B, and generate the second read disable signal RDED_B. The second read decoding signal ERD11_B may be generated by the command decoding circuit 230 of FIG. 3, and the second read decoding signal ERD11_B may be described below with reference to FIG. 12.

The first and second read clock control circuits 261 and 262 of FIG. 11 may have similar configurations to the first and second write clock control circuits 241 and 242 of FIG. 7. In other words, the first read clock control circuit 261 may generate the first read clock signal RCLKB_A, compared to the first write clock control circuit 241. The second read clock control circuit 262 may generate the second read clock signal RCLKB_B, compared to the second write clock control circuit 242.

Referring back to FIG. 6, a read control circuit 270 may perform a control operation related to a read operation based on the first or second read clock signal RCLKB_A or RCLKB_B generated by the read clock control circuit 260. The integrated circuit in accordance with the embodiment of the present disclosure may enable the first or second read clock signal RCLKB_A or RCLKB_B based on the first or second clock enable signal ENCLK_A or ENCLK_B. Therefore, the integrated circuit may use the first or second read clock signal RCLKB_A or RCLKB_B when performing the control operation related to the read operation, thereby reducing power consumption during the control operation related to the read operation.

Figure 12:
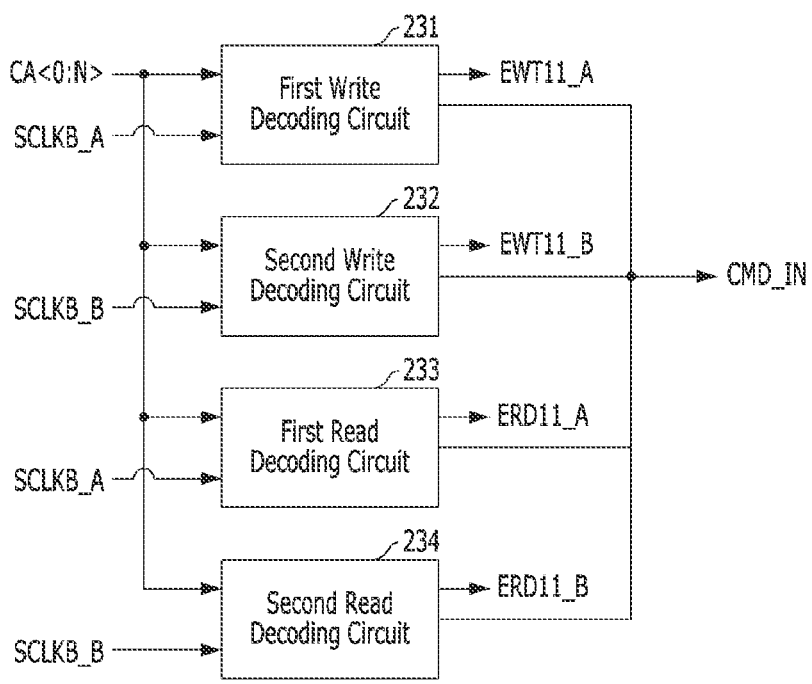
FIG. 12 is a block diagram illustrating a configuration of a command decoding circuit of FIG. 3.

FIG. 12 is a block diagram illustrating a configuration of the command decoding circuit 230 of FIG. 3.

Referring to FIG. 12, the command decoding circuit 230 may be configured to synchronize and decode the external command signal CA<0:N> based on the first or second synchronization clock signal SCLKB_A or SCLKB_B, as described above. The command decoding circuit 230 may include a first write decoding circuit 231, a second write decoding circuit 232, a first read decoding circuit 233 and a second read decoding circuit 234.

The first write decoding circuit 231 may be configured to synchronize and decode the external command signal CA<0:N> corresponding to a write command based on the first synchronization clock signal SCLKB_A. The second write decoding circuit 232 may be configured to synchronize and decode the external command signal CA<0:N> corresponding to the write command based on the second synchronization clock signal SCLKB_B. The first read decoding circuit 233 may be configured to synchronize and decode the external command signal CA<0:N> corresponding to a read command based on the first synchronization clock signal SCLKB_A. The second read decoding circuit 234 may be configured to synchronize and decode the external command signal CA<0:N> corresponding to the read command based on the second synchronization clock signal SCLKB_B.

Although described below, the first write decoding circuit 231 may generate the first write decoding signal EWT11_A, and provide the first write decoding signal EWT11_A to the first write disable control circuit 2413 of FIG. 7. The second write decoding circuit 232 may generate the second write decoding signal EWT11_B, and provide the second write decoding signal EWT11_B to the second write disable control circuit 2423 of FIG. 7. The first read decoding circuit 233 may generate the first read decoding signal ERD11_A, and provide the first read decoding signal ERD11_A to the first read disable control circuit 2613 of FIG. 11. The second read decoding circuit 234 may generate the second read decoding signal ERD11_B, and provide the second read decoding signal ERD11_B to the second read disable control circuit 2623 of FIG. 11.

Since the internal configurations of the first write decoding circuit 231, the second write decoding circuit 232, the first read decoding circuit 233 and the second read decoding circuit 234 are similar to one another, the following descriptions will be focused on the first write decoding circuit 231, for convenience of description.

Figure 13:
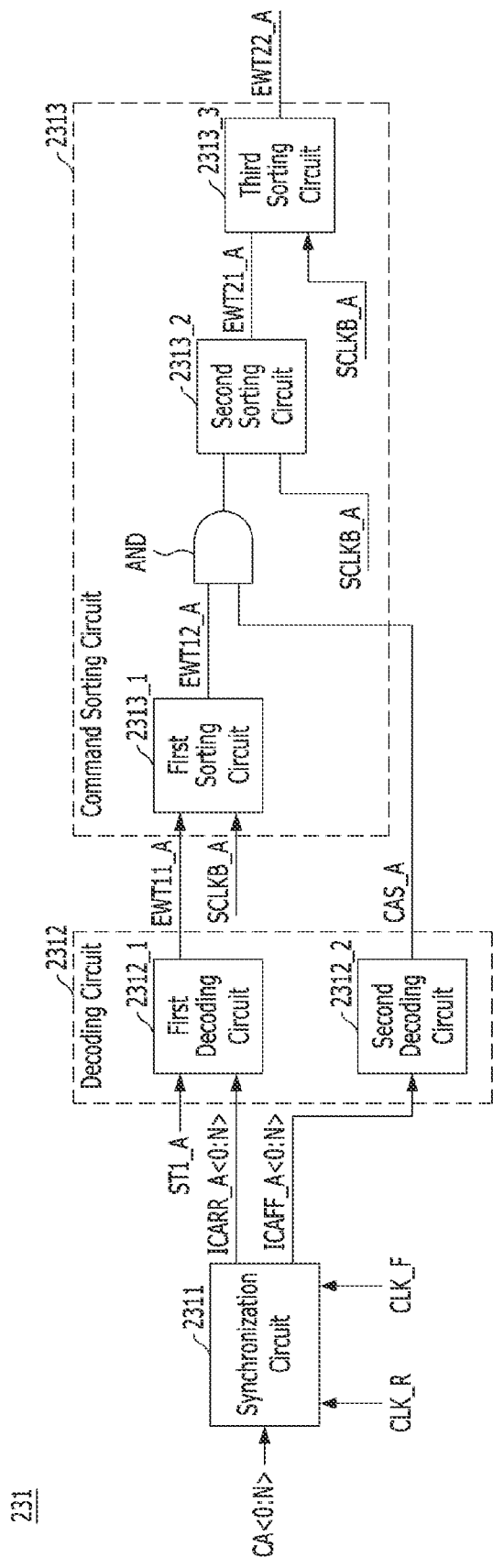
FIG. 13 is a diagram illustrating a configuration of a first write decoding circuit of FIG. 12.

FIG. 13 is a diagram illustrating a configuration of the first write decoding circuit 231 of FIG. 12.

Referring to FIG. 13, the first write decoding circuit 231 may include a synchronization circuit 2311, a decoding circuit 2312 and a command sorting circuit 2313.

The synchronization circuit 2311 may be configured to output the external command signal CA<0:N> in synchronization with edge clock signals CLK_R and CLK_F. The edge clock signals CLK_R and CLK_F may include a rising clock signal CLK_R corresponding to a rising edge of the first synchronization clock signal SCLKB_A and a falling clock signal CLK_F corresponding to a falling edge of the first synchronization clock signal SCLKB_A. Thus, the synchronization circuit 2311 may generate a rising command signal ICARR_A<0:N> by synchronizing the external command signal CA<0:N> with the rising clock signal CLK_R. Thus, the synchronization circuit 2311 may generate a falling command signal ICAFF_A<0:N> by synchronizing the external command signal CA<0:N> with the falling clock signal CLK_F.

The decoding circuit 2312 may be configured to decode an output signal of the synchronization circuit 2311. The decoding circuit 2312 may decode the rising command signal ICARR_A<0:N> and the falling command signal ICAFF_A<0:N>, and output the decoded signals. The decoding circuit 2312 may include a first decoding circuit 2312_1 and a second decoding circuit 2312_2. The first decoding circuit 2312_1 may decode the first shifting signal ST1_A and the rising command signal ICARR_A<0:N> of FIG. 4, and output the decoded signals. The second decoding circuit 2312_2 may decode the falling command signal ICAFF_A<0:N>, and output the decoded signal.

The command sorting circuit 2313 may be configured to sort the output signal of the decoding circuit 2312 based on the first synchronization clock signal SCLKB_A. The command sorting circuit 2313 may include a first sorting circuit 2313_1, a second sorting circuit 23132, a third sorting circuit 2313_3 and a logic circuit.

First, the first sorting circuit 2313_1 may shift the first write decoding signal EWT11_A generated by the first decoding circuit 2312_1 based on the first synchronization clock signal SCLKB_A. An AND gate AND may receive an output signal EWT12_A of the first sorting circuit 2313_1 and an output signal CAS_A of the second decoding circuit 2312_2. The second sorting circuit 23132 may shift the output signal of the AND gate AND based on the first synchronization clock signal SCLKB_A. The third sorting circuit 2313_3 may shift an output signal EWT21_A of the second sorting circuit 2313_2 based on the first synchronization clock signal SCLKB_A. The output signals EWT12_A, EWT21_A and EWT22_A of the first to third sorting circuits 2313_1 to 2313_3, including the first write decoding signal EWT11_A, may become the internal command signal CMD_IN (see FIG. 12) synchronized with the first synchronization clock signal SCLKB_A.

Referring back to FIG. 12, the first write decoding circuit 231 may synchronize and decode the external command signal CA<0:N> corresponding to a write command based on the first synchronization clock signal SCLKB_A. The first write decoding circuit 231 may generate the internal command signal CMD_IN synchronized with the first synchronization clock signal SCLKB_A through the synchronization and decoding operation.

Each of the second write decoding circuit 232, the first read decoding circuit 233 and the second read decoding circuit 234 may have a similar structure to the first write decoding circuit 231 described with reference to FIG. 13. Thus, the second write decoding circuit 232 may synchronize and decode the external command signal CA<0:N> corresponding to the write command based on the second synchronization clock signal SCLKB_B. The second write decoding circuit 232 may generate the internal command signal CMD_IN synchronized with the second synchronization clock signal SCLKB_B through the synchronization and decoding operation. In an embodiment, the command sorting circuit of the first read decoding circuit 233 may sort an output signal of the decoding circuit of the first read decoding circuit 233 based on the first synchronization clock signal SCLKB_A. In an embodiment, the command sorting circuit of the second read decoding circuit 234 may sort an output signal of the decoding circuit of the second read decoding circuit 234 based on the second synchronization clock signal SCLKB_B.

Then, the first read decoding circuit 233 may synchronize and decode the external command signal CA<0:N> corresponding to a read command based on the first synchronization clock signal SCLKB_A. The first read decoding circuit 233 may generate the internal command signal CMD_IN synchronized with the first synchronization clock signal SCLKB_A through the synchronization and decoding operation.

The second read decoding circuit 234 may synchronize and decode the external command signal CA<0:N> corresponding to the read command based on the second synchronization clock signal SCLKB_B. The second read decoding circuit 234 may generate the internal command signal CMD_IN synchronized with the second synchronization clock signal SCLKB_B through the synchronization and decoding operation.

Figure 14:
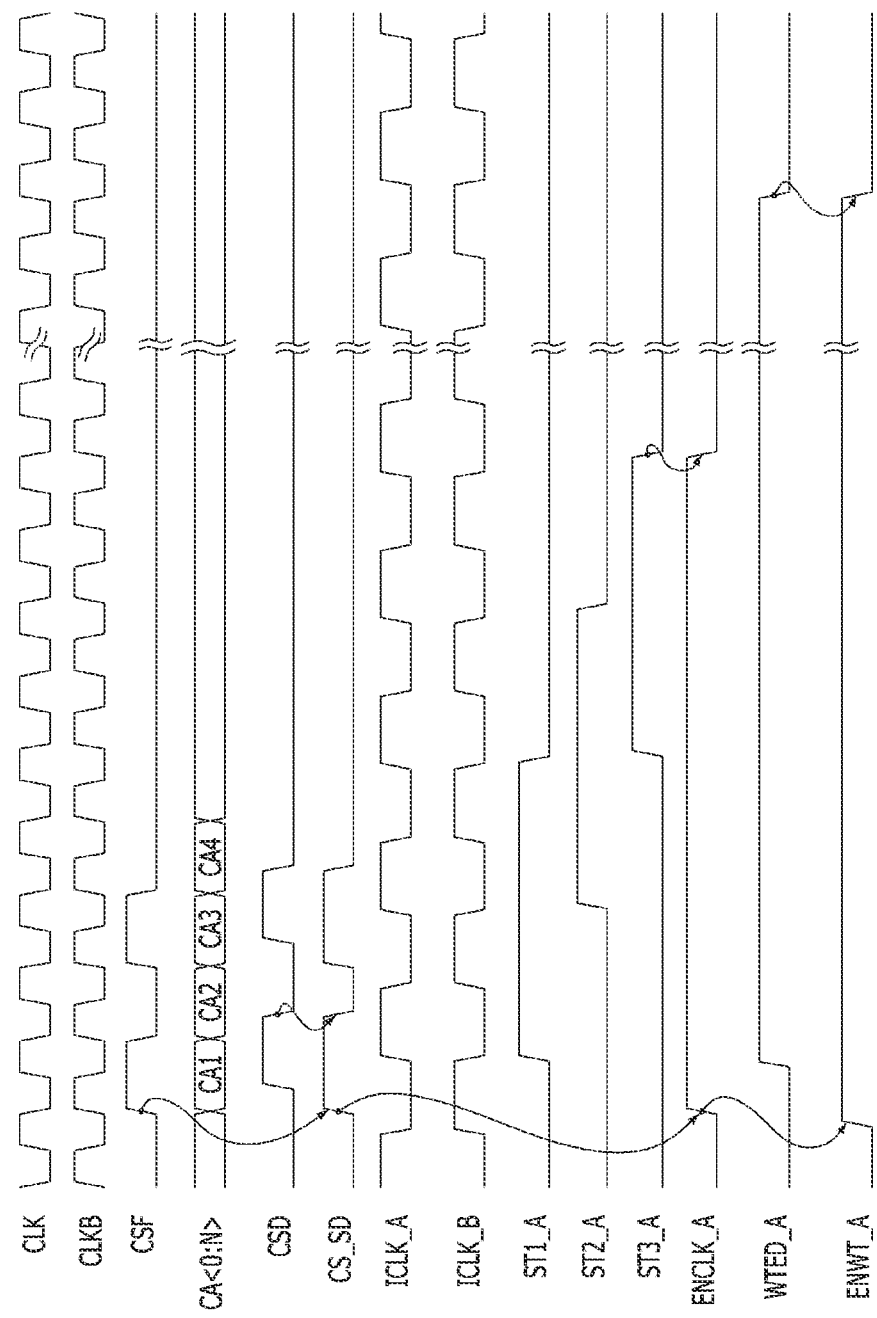
FIG. 14 is a timing diagram illustrating operation timing of the integrated circuit of FIGS. 1 to 13.

FIG. 14 is a timing diagram illustrating operation timing of the integrated circuit of FIGS. 1 to 13. For convenience of description, the case in which the external command signal CA<0:N> is a write command and the chip select signal CS is synchronized with the first divided clock signal CLKD_A will be taken as an example for description.

Referring to FIGS. 1 to 14, the clock generation circuit 100 of FIG. 1 may receive the primary external clock signal CLK and the secondary external clock signal CLKB which toggle at a high frequency. The divider circuit 120 of FIG. 2 may generate the first and second divided clock signals CLKD_A and CLKD_B by dividing the primary external clock signal CLK and the secondary external clock signal CLKB. The enable control circuit 210 of FIG. 4 may generate the first internal clock signal ICLK_A corresponding to the first divided clock signal CLKD_A, and generate the second internal clock signal ICLK_B corresponding to the second divided clock signal CLKD_B.

The command generation circuit 200 of FIG. 1 may receive the chip select signal CS and the external command signal CA<0:N>. The chip select signal CS may include two pulses corresponding to the write command. The external command signal CA<0:N> may be composed of information corresponding to the write command and address information related thereto, for example. In the present embodiment, the case in which 'CA1', 'CA2', 'CA3' and 'CA4' are input as the external command signal CA<0:N> will be taken as an example.

The buffer circuit 211 of FIG. 4 may generate the buffered chip select signal CSF based on the chip select signal CS, and the delay circuit 212 may generate the delayed chip select signal CSD based on the buffered chip select signal CSF. The chip select pulse signal CS_SD may have a pulse that is enabled based on the buffered chip select signal CSF, and disabled based on the delayed chip select signal CSD.

The first unit shifting circuit 2131 of FIG. 4 may synchronize the chip select pulse signal CS_SD based on the first internal clock signal ICLK_A. Therefore, the first to third unit shifting circuits 2131 to 2133 may generate the first to third shifting signals ST1_A to ST3_A shifted by the first internal clock signal ICLK_A. The first clock enable signal ENCLK_A may be enabled based on the chip select pulse signal CS_SD, and disabled based on the point of time that the third shifting signal ST3_A is disabled. Therefore, the clock control circuit 220 of FIG. 3 may enable a toggling operation for the first synchronization clock signal SCLKB_A based on the first clock enable signal ENCLK_A. At this time, since the toggling operation for the second synchronization clock signal SCLKB_B may be disabled, power consumption by toggling can be reduced.

The first write disable control circuit 2413 of FIG. 7 may generate the first write disable signal WTED_A by shifting the first write decoding signal EWT11_A by a write operation time. The first write enable signal generation circuit 2411 of FIG. 7 may generate the first write enable signal ENWT_A based on the first clock enable signal ENCLK_A and the first write disable signal WTED_A. Thus, the first write enable signal ENWT_A may be enabled based on the first clock enable signal ENCLK_A, and disabled based on the first write disable signal WTED_A. Then, the first write clock generation circuit 2412 of FIG. 7 may enable a toggling operation for the first write clock signal WCLKB_A based on the first write disable signal WTED_A. At this time, since the toggling operation for the second write clock signal WCLKB_B may be disabled, power consumption by toggling can be reduced.

The integrated circuit in accordance with the present embodiments may generate the first and second divided clock signals CLKD_A and CLKD_B which are low-frequency internal clock signals, thereby raising the accuracy of the command recognition operation. Furthermore, the power consumption during the synchronization and decoding operation for the command signal may be reduced through the low-frequency first and second divided clock signals CLKD_A and CLKD_B.

While various embodiments have been described above, it will be understood to those skilled in the art that the embodiments described are examples only. Accordingly, the operating method of a data storage device described herein should not be limited based on the described embodiments.

What is claimed is:

1. An integrated circuit comprising:
   a clock generation circuit configured to generate first and second divided clock signals by dividing an external clock signal; and
   a command generation circuit configured to synchronize and decode an external command signal based on a divided clock signal of the first and second divided clock signals, which is synchronized with a chip select signal, wherein the command generation circuit comprises:
   an enable control circuit configured to generate a clock enable signal corresponding to the first or second divided clock signal based on a divided clock signal of the first and second divided clock signals, which toggles at the point of time that the chip select signal is input;
   a clock control circuit configured to control an enable operation of synchronization clock signals corresponding to the first and second divided clock signals, respectively, based on the clock enable signal; and
   a command decoding circuit configured to synchronize and decode the external command signal based on the synchronization clock signal.

2. The integrated circuit according to claim 1, wherein the clock generation circuit comprises:
   a buffer circuit configured to buffer the external clock signal; and
   a divider circuit configured to generate the first and second divided clock signals by dividing the clock signal output from the buffer circuit.

3. The integrated circuit according to claim 1, wherein the enable control circuit comprises:
   a first shifting circuit configured to shift the chip select signal by a synchronization and decoding operation time for the external command signal, based on the first divided clock signal;
   a first logic control circuit configured to generate a first clock enable signal having an active interval that is set based on the chip select signal and an output signal of the first shifting circuit;
   a second shifting circuit configured to shift the chip select signal by the synchronization and decoding operation time for the external command signal, based on the second divided clock signal; and
   a second logic control circuit configured to generate a second clock enable signal having an active interval that is set based on the chip select signal and an output signal of the second shifting circuit.

4. The integrated circuit according to claim 1, wherein the clock control circuit comprises:
   a first synchronization clock generation circuit configured to output the first divided clock signal as a first synchronization clock signal based on the first clock enable signal corresponding to the first divided clock signal; and
   a second synchronization clock generation circuit configured to output the second divided clock signal as a second synchronization clock signal based on the second clock enable signal corresponding to the second divided clock signal.

5. The integrated circuit of claim 1, further comprising:
a write clock control circuit configured to control an enable operation of a write clock signal based on the clock enable signal; and
a read clock control circuit configured to control an enable operation of a read clock signal based on the clock enable signal.

6. The integrated circuit according to claim 5, wherein the write clock control circuit comprises:
a first write clock control circuit configured to generate a first write clock signal based on the first clock enable signal corresponding to the first divided clock signal; and
a second write clock control circuit configured to generate a second write clock signal based on the second clock enable signal corresponding to the second divided clock signal.

7. The integrated circuit according to claim 6, wherein the first write clock control circuit comprises:
a first write enable signal generation circuit configured to generate a first write enable signal having an active interval that is set based on the first clock enable signal and a first write disable signal;
a first write clock generation circuit configured to output the first divided clock signal as the first write clock signal based on the first write enable signal; and
a first write disable control circuit configured to shift a write decoding signal based on the first write clock signal, and generate the first write disable signal.

8. The integrated circuit according to claim 7, wherein the second write clock control circuit comprises:
a second write enable signal generation circuit configured to generate a second write enable signal having an active interval that is set based on the second clock enable signal and a second write disable signal;
a second write clock generation circuit configured to output the second divided clock signal as the second write clock signal based on the second write enable signal; and
a second write disable control circuit configured to shift a write decoding signal based on the second write clock signal, and generate the second write disable signal.

9. The integrated circuit according to claim 5, wherein the read clock control circuit comprises:
a first read clock control circuit configured to generate a first read clock signal based on the first clock enable signal corresponding to the first divided clock signal; and
a second read clock control circuit configured to generate a second read clock signal based on the second clock enable signal corresponding to the second divided clock signal.

10. The integrated circuit according to claim 9, wherein the first read clock control circuit comprises:
a first read enable signal generation circuit configured to generate a first read enable signal having an active interval that is set based on the first clock enable signal and a first read disable signal;
a first read clock generation circuit configured to output the first divided clock signal as the first read clock signal based on the first read enable signal; and
a first read disable control circuit configured to shift a read decoding signal based on the first read clock signal, and generate the first read disable signal.

11. The integrated circuit according to claim 9, wherein the second read clock control circuit comprises:
a second read enable signal generation circuit configured to generate a second read enable signal having an active interval that is set based on the second clock enable signal and a second read disable signal;
a second read clock generation circuit configured to output the second divided clock signal as the second read clock signal based on the second read enable signal; and
a second read disable control circuit configured to shift a read decoding signal based on the second read clock signal, and generate the second read disable signal.

12. The integrated circuit according to claim 1, wherein the command decoding circuit comprises:
a first write decoding circuit configured to synchronize and decode the external command signal corresponding to a write command based on the first synchronization clock signal corresponding to the first divided clock signal;
a second write decoding circuit configured to synchronize and decode the external command signal corresponding to the write command based on the second synchronization clock signal corresponding to the second divided clock signal;
a first read decoding circuit configured to synchronize and decode the external command signal corresponding to a read command based on the first synchronization clock signal; and
a second read decoding circuit configured to synchronize and decode the external command signal corresponding to the read command based on the second synchronization clock signal.

13. The integrated circuit according to claim 12, wherein each of the first write decoding circuit and the first read decoding circuit comprises:
a synchronization circuit configured to output the external command signal in synchronization with an edge clock signal;
a decoding circuit configured to decode an output signal of the synchronization circuit; and
a command sorting circuit configured to sort an output signal of the decoding circuit based on the first synchronization clock signal.

14. The integrated circuit according to claim 12, wherein each of the second write decoding circuit and the second read decoding circuit comprises:
a synchronization circuit configured to output the external command signal in synchronization with an edge clock signal;
a decoding circuit configured to decode an output signal of the synchronization circuit; and
a command sorting circuit configured to sort an output signal of the decoding circuit based on the second synchronization clock signal.

* * * * *

UNITED STATES PATENT AND TRADEMARK OFFICE
CERTIFICATE OF CORRECTION

| | |
|---|---|
| PATENT NO. | : 11,329,651 B2 |
| APPLICATION NO. | : 17/150680 |
| DATED | : May 10, 2022 |
| INVENTOR(S) | : Woongrae Kim |

It is certified that error appears in the above-identified patent and that said Letters Patent is hereby corrected as shown below:

In the Claims

Column 17, Line 34, Claim 8, should read as follows:
8. The integrated circuit according to claim 6, wherein the second write clock control circuit comprises:
a second write enable signal generation circuit configured to generate a second write enable signal having an active interval that is set based on the second clock enable signal and a second write disable signal;
a second write clock generation circuit configured to output the second divided clock signal as the second write clock signal based on the second write enable signal; and
a second write disable control circuit configured to shift a write decoding signal based on the second write clock signal, and generate the second write disable signal.

Signed and Sealed this
Twelfth Day of July, 2022

*Katherine Kelly Vidal*

Katherine Kelly Vidal
*Director of the United States Patent and Trademark Office*